United States Patent [19]

Call et al.

[11] Patent Number: 5,172,365
[45] Date of Patent: Dec. 15, 1992

[54] SYSTEM FOR PREDICTING LASER END-OF LIFE FROM THE POWER VS. CURRENT CURVE OF THE DIODE

[75] Inventors: David E. Call; Blair I. Finkelstein, both of Tucson, Ariz.; Catherine S. Singer, Poughkeepsie, N.Y.

[73] Assignee: International Business Machines Corporation, Armonk, N.Y.

[21] Appl. No.: 757,743

[22] Filed: Sep. 11, 1991

[51] Int. Cl.$^5$ ............................................. G11B 7/125
[52] U.S. Cl. ...................................... 369/116; 372/46; 324/158 D
[58] Field of Search .............. 369/116, 44.27; 372/29, 372/31, 38, 46; 324/158 D

[56] References Cited

U.S. PATENT DOCUMENTS 4,489,477  12/1984  Chik et al. ........................ 324/158 D
4,573,255   3/1986  Gordon et al. ......................... 29/574
4,611,166   9/1986  Batt ..................................... 250/239

FOREIGN PATENT DOCUMENTS 61-253651  11/1986  Japan .

Primary Examiner—Jack I. Berman
Assistant Examiner—James Beyer
Attorney, Agent, or Firm—Greenlee & Winner

[57] ABSTRACT

Method and apparatus for predicting the approach of semiconductor laser diode end-of-life from the power vs. current characteristic curve of the diode thereby obviating the need for nonvolatile memory. Current measurements are taken for three power levels and the linear slope of the characteristic curve at the high power level is compared to the linear slope at low power levels. When the comparison exceeds predetermined criteria, a flag is raised.

10 Claims, 3 Drawing Sheets

SYSTEM FOR PREDICTING LASER END-OF LIFE FROM THE POWER VS. CURRENT CURVE OF THE DIODE

This invention relates to semiconductor laser diodes and more particularly to a system for detecting the approach of laser end-of-life without the utilization of nonvolatile memory.

BACKGROUND OF THE INVENTION

Optical disk devices are a medium for storing large quantities of computer prepared data. When several optical disk drives are grouped together in a library system very large amounts of data are available to the computing system. However, if an optical disk drive fails, a replacement drive must either be available, or a special service call must be placed. Studies have shown that one of the major causes of failure for optical disk drives is failure of the semiconductor laser diode which produces a laser beam to read and write data on the optical media. The conventional method for detecting the approach of laser end-of-life is to monitor the operating current. If the current required to maintain a given operating point changes by a certain percentage the end-of-life is flagged. Such a conventional method cannot be used in a drive that does not have nonvolatile memory.

U.S. Pat. No. 5,019,769 describes an approach to predicting laser diode end-of-life by recording the operating characteristics of the laser in nonvolatile memory, analyzing changes in those characteristics, and generating a failure warning message when those changes match predefined failure prediction criteria.

Without nonvolatile memory, once the drive is disconnected from its power source the machine will lose its ability to recall previous current settings. Therefore, it is the general object of this invention to provide apparatus for determining when a laser is about to fail based upon the characteristics of the laser itself, obviating the need to utilize nonvolatile memory.

SUMMARY OF THE INVENTION

It is observed that the slope of the power-current curve for a semiconductor laser diode changes as the diode ages. However, the inventors have also observed that the slope of the curve at lower power levels remains relatively constant; it is the slope at higher power levels that changes significantly with age. This invention makes use of these observations by periodically measuring the slope of the characteristic curve at both lower and higher power levels. When the diode is new the slope at both power levels will be approximately the same but as the diode ages the slope at the higher power level will change appreciably from the slope at the lower power level. When a certain threshold difference in slope is exceeded, for example, when the difference becomes more than 10%, a flag is raised to indicate an approaching laser end-of-life.

DETAILED DESCRIPTION

Figure 1:
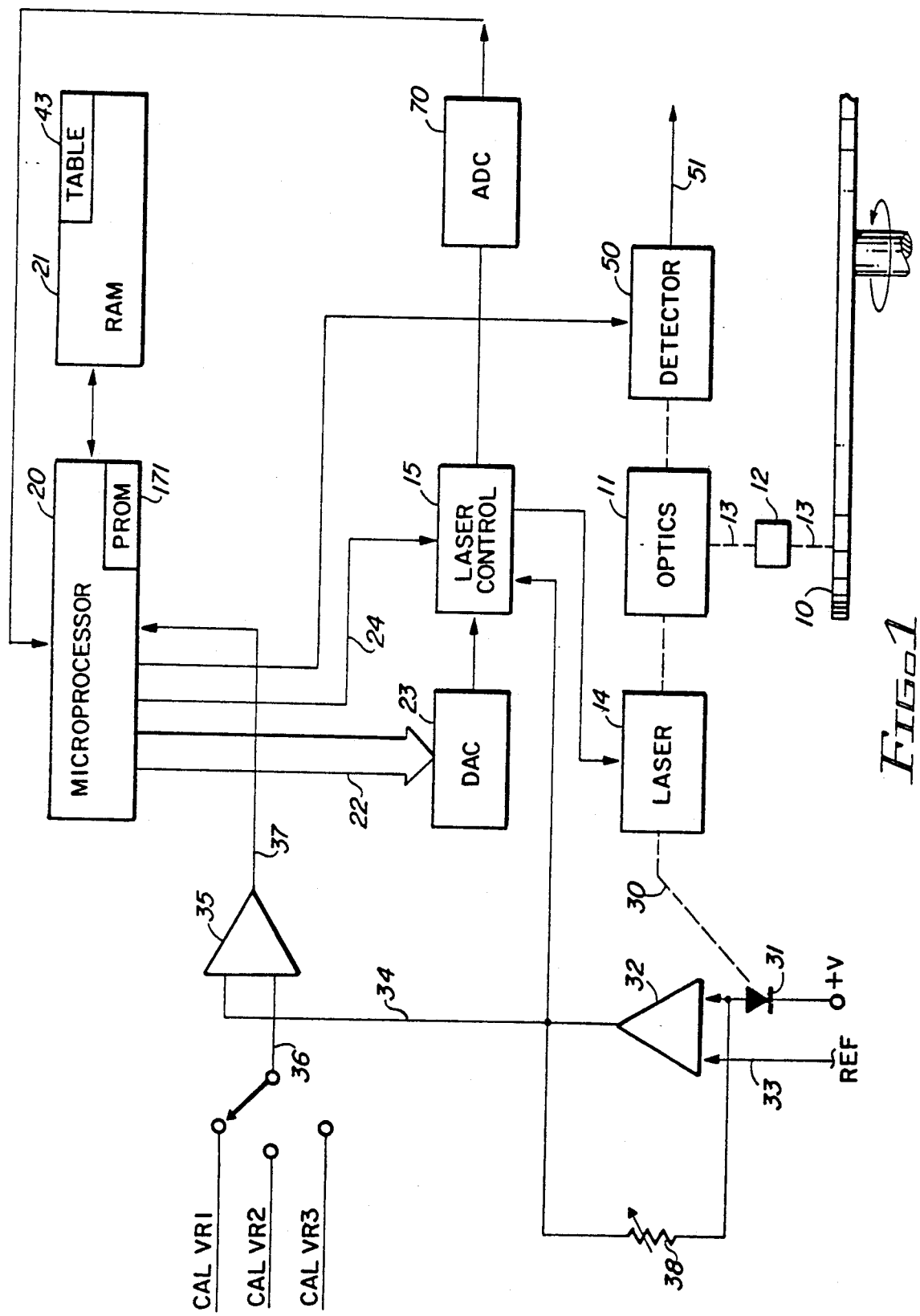
FIG. 1 is a simplified block diagrammatic showing of an optical disk recorder employing the present invention.

Referring now more particularly to the appended drawing, like numerals indicate like parts and structural features in the various figures. A disk 10 is suitably mounted for rotation in an optical disk recorder (mechanical details not shown). An optical system 11 which includes the usual beam splitters, and the like, supplies a light beam generated by laser 14 through objective lens 12 over light path 13 and receives reflected light from disk 10 over the same path and objective lens 12. The light beam is directed through optics 11 to disk 10 as controlled by laser control 15. The FIG. 1 illustrated recorder-player is under control of a programmed microprocessor 20 which has a random access memory (RAM) 21. Microprocessor 20 supplies a digital value over cable 22 to digital to analog converter (DAC) 23. DAC 23 supplies an analog signal to laser control 15 for setting the beam intensity emitted by laser 14 to optics 11. Such laser output light intensity includes modulation based upon data as supplied by microprocessor 20, or other data handling circuits. Line 24, extending from microprocessor 20 to laser control 15, signifies additional mode control for controlling the laser control circuits 15.

An analog to digital converter (ADC) 70 is included in the circuit of FIG. 1 to measure laser drive current, convert to a digital value and supply the digital values to a microprocessor 20.

Laser 14 is controlled in intensity by a feedback circuit in laser control 15. In FIG. 1 the laser 14 is shown as emitting an auxiliary beam over light path 30 to a photo diode 31. The photo diode current amplitude varies in accordance with the laser 14 emitted light over path 30, as is known. If desired, the main beam 13 may be used to illuminate the photo diode by passing the beam through appropriate optical components including beam splitters. Transimpedance amplifier 32 responds to the diode 31 changed current amplitude compared with a reference value on line 33 to supply signals over line 34 indicative of laser 14 output beam intensity. Potentiometer 38 is used to adjust the gain of the transimpedance amplifier. This adjustment effects a calibrated signal level on line 34 in volts per watt. As a result, the signal level on line 34 represents the light power output of laser 14. Laser control 15, under normal operations, responds to the signal level on line 34 to maintain the laser 14 operation at predetermined intensity values, as is known.

Additional circuits are provided for processing the line 34 signal for enabling automatic calibration of DAC 23 such that numerical values on cable 22 accurately represent a desired light intensity output of laser 14. DAC 23 is calibrated based upon increases in laser 14 intensity between a low or safe power level $P_1$, a high power level $P_3$, and a third in between power level $P_2$.

An analog comparator 35 receives the line 34 signal at one input for receiving an indication of the laser 14 output light intensity. On line 36 the second input to comparator 35, is a reference value CAL VR1 indicative of the desired low power level $P_1$. Comparator 35 supplies an inactive signal over line 37 to microprocessor 20 at all times until the signal on line 34 indicates that laser 14 has attained the power level $P_1$. At this time comparator 35 supplies an active signal over line 37 to microprocessor 20. Microprocessor 20 then stores the DAC 23 input value in table 43 for later calculating values to be used in controlling laser 14 and for calculating slope ratios to determine whether laser end-of-life (EOL) is approaching.

Next, reference voltage CAL VR2 is connected on line 36 to comparator 35 to indicate an in between power level $P_2$. The microprocessor 20 continuously increases the numerical value over cable 22 to thereby cause DAC 23 to actuate laser 14 to ever increasing power levels for increasing output light intensities. This repetitive step by step increasing continues until comparator 35 detects a signal on line 34 at its first input which indicates that power level $P_2$ has been attained. As soon as comparator 35 determines that the line 34 signal equals or exceeds the reference signal on line 36, then an active signal is supplied over line 37 to microprocessor 20, whereupon microprocessor 20 stores that DAC 23 input value in table 43.

The same procedure is exercised a third time to establish a DAC 23 value for power level $P_3$ by utilizing CAL VR3 as the reference voltage on line 36.

Figure 2:
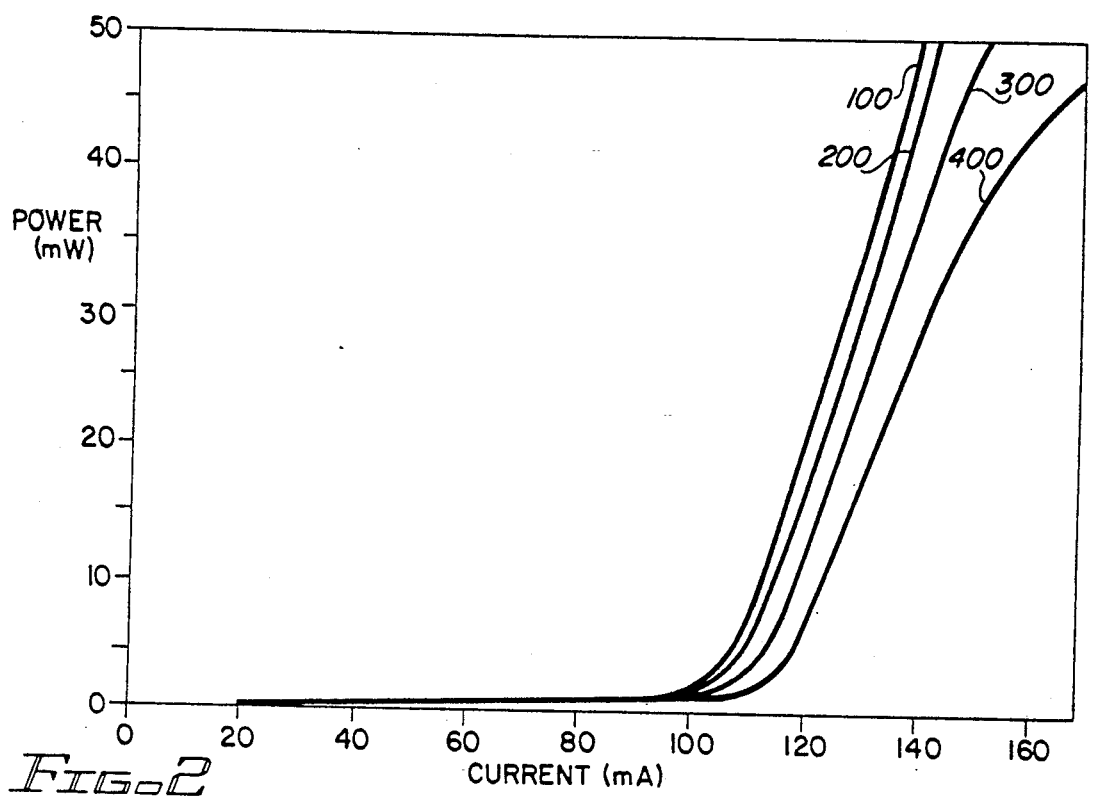
FIG. 2 shows a family of P-I curves taken over a period of time as a laser diode ages.

FIG. 2 shows a family of curves which illustrate the power versus current characteristic of a laser diode as the diode ages. Curve 100 shows the characteristic curve of the diode when it is new, while curves 200, 300, and 400 show the characteristic curve at various periods of time later in the life of the laser diode. Note that as the diode ages the slope of the curve at high power levels changes noticeably while the slope remains nearly constant at lower power levels.

Figure 3:
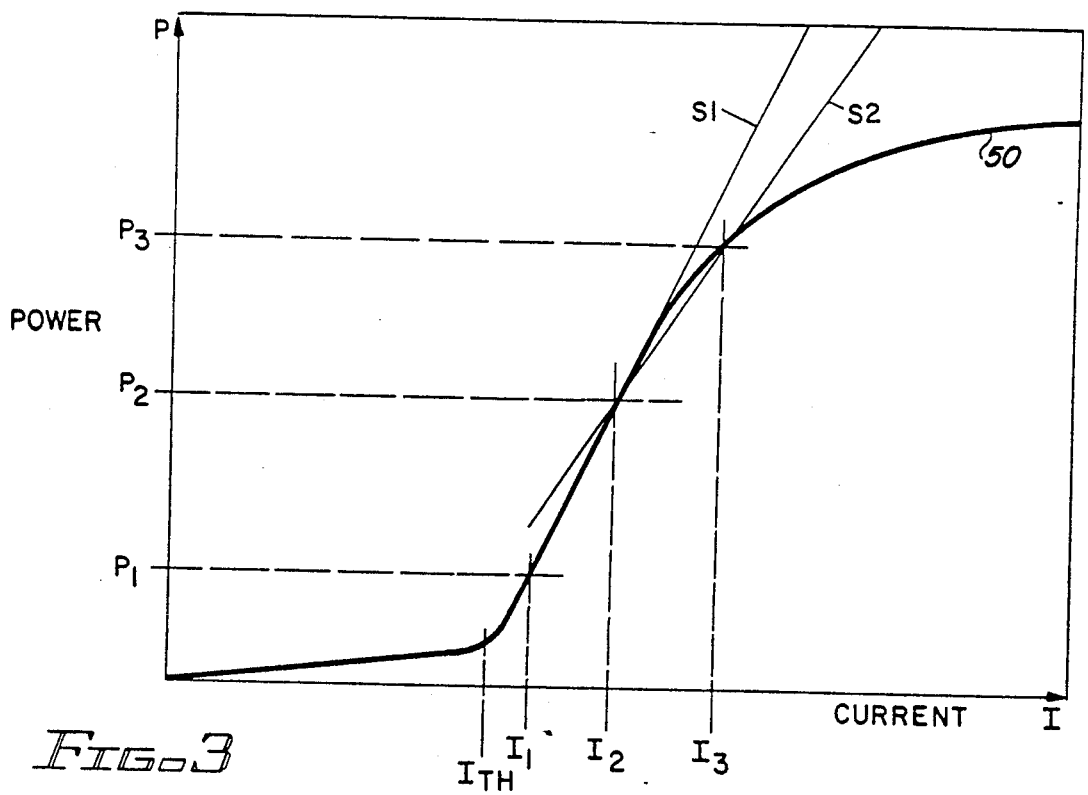
FIG. 3 shows the P-I curve with two different slopes taken in accordance with the present invention.

FIG. 3 illustrates a P-I curve 500 in which the slope S1 is calculated at a low power level between power levels $P_2$ and $P_1$. The slope S2 at a high power level is calculated between the power levels $P_3$ and $P_2$. By comparing the slopes of these two portions of the characteristic curve a diode which is approaching end-of-life can be detected.

The current $I_1$ needed to produce power $P_1$ is produced by a certain setting on the digital to analog converter (DAC) 23 and that setting is designated $DAC_1$. Power level $P_2$ is produced by current level $I_2$ at DAC 23 setting $DAC_2$. Power level $P_3$ is produced by current $I_3$ at DAC 23 setting $DAC_3$. $I_{th}$ is the threshold current at which the laser diode enters lasing mode.

In a convenient circuit design to implement this invention $I_1$ is set equal to $I_{th} + \gamma DAC1$
where $\gamma = $ DAC gain (mA/DAC step)

The expression for calculating the slope of the characteristic curve 500 between power levels $P_1$ and $P_2$ is as follows:

$$S_1 = \frac{P_2 - P_1}{I_2 - I_1} = \frac{P_2 - P_1}{[I_{th} + \gamma DAC2] - [I_{th} + \gamma DAC_1]} \quad (1)$$

$$= \frac{P_2 - P_1}{\gamma(DAC_2 - DAC_1)}$$

The expression for calculating the slope of the characteristic curve 500 between power levels $P_2$ and $P_3$ is as follows:

$$S_2 = \frac{P_3 - P_2}{I_3 - I_2} = \frac{P_3 - P_2}{\gamma(DAC_3 - DAC_2)} \quad (2)$$

The ratio of slope $S_2$ to slope $S_1$ is as follows $$S_2/S_1 = \frac{(P_3 - P_2)/(I_3 - I_2)}{(P_2 - P_1)/(I_2 - I_1)} = \frac{(P_3 - P_2)/\gamma(DAC_3 - DAC_2)}{(P_2 - P_1)/\gamma(DAC_2 - DAC_1)}$$

$$S_2/S_1 = \quad (3)$$

$$\frac{(P_3 - P_2)/(DAC_3 - DAC_2)}{(P_2 - P_1)/(DAC_2 - DAC_1)} = \frac{(P_3 - P_2)(DAC_2 - DAC_1)}{(P_2 - P_1)(DAC_3 - DAC_2)}$$

Thus, an expression for the ratio of the slopes of the P-I characteristic curve is dependent solely on the power levels and the DAC settings for producing those power levels.

The above expression can also be written in terms of power and laser current so that where an ADC is available in the circuit to measure laser current, the ratio of slopes can be determined in that manner.

$$S2/S1 = \frac{(P_3 - P_2)(I_2 - I_1)}{(P_2 - P_1)(I_3 - I_2)} = \frac{(P_3 - P_2)(ADC_2 - ADC_1)}{(P_2 - P_1)(ADC_3 - ADC_2)} \quad (4)$$

Figure 4:
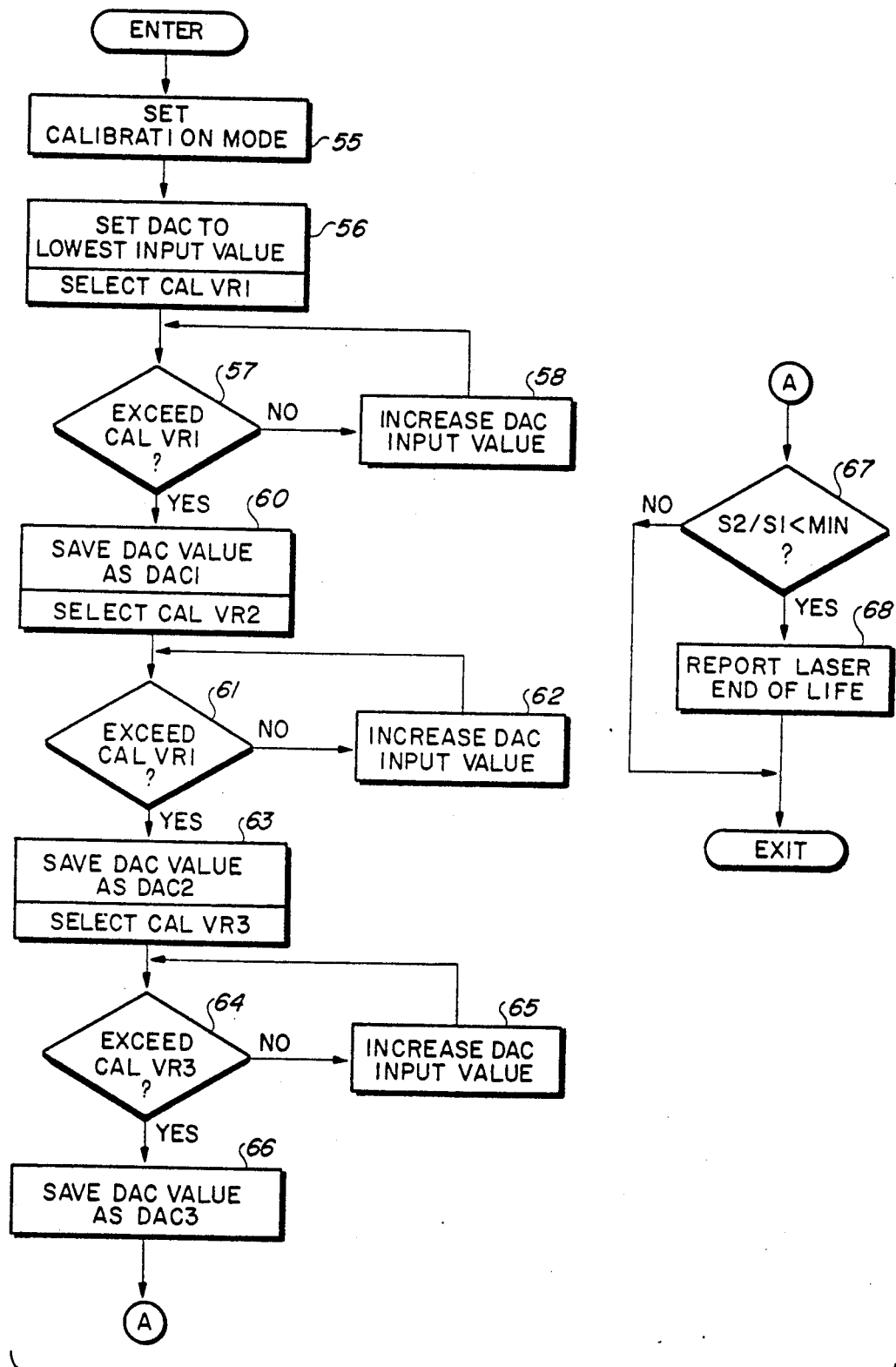
FIG. 4 is a chart of machine operations in accordance with the present invention.

FIG. 4 illustrates in flow chart form the machine operations to implement the invention with respect to the FIG. 1 illustrated recorder. At machine step 55 microprocessor 20 sets the calibration mode for operating the laser 14. Calibration mode merely means that laser 14 is continuously on at a constant laser output intensity. At machine step 56, microprocessor 20 supplies a number over line 22 for setting DAC 23 to a low light power level for laser 14. At machine step 57, microprocessor 20 examines the signal state of line 37 to determine whether or not the measured light intensity from laser 14 over light path 30 is exceeding the power level $P_1$ indicated by the signal CAL VR1 on line 36. Normally during a first step the limit is not exceeded whereupon the DAC 23 value is increased at machine step 58. Machine step 57 is then reentered and steps 57 and 58 are repeated until comparator 35 determines that the limit for the calibration has been exceeded. At that time, microprocessor 20 in machine step 60 stores in table 43 DAC1, the DAC input value for actuating laser 14 to emit light at the $P_1$ power level. The laser current may alternately be measured with the ADC as ADC1.

The procedure used in above-described machine steps 57 and 58 is used in machine steps 61 and 62 for determining the $P_2$ laser power output level. At machine step 61, microprocessor 20 senses the signal state of line 37 (comparator 35 output). If the line 37 signal is in an inactive state, then the line 34 signal is less that the amplitude supplied over line 36, i.e. the laser 14 output light intensity is less than the desired level. The DAC 23 input value is increased in machine step 62 and machine steps 61-62 are repeated until comparator 35 supplies an active signal to line 37. When the level CAL VR2 is exceeded as detected at machine step 61, microprocessor 20 saves the DAC 23 input value in table 43 as DAC2, the DAC input value resulting in a laser 14 output light power of $P_2$. The ADC2 level may also be saved as representing the laser current producing power level $P_2$.

Finally, the steps 64 and 65 are performed in a manner similar to that described above with respect to steps 57 and 58 in order to arrive at a DAC value which provides an active signal on line 37 when the level CAL VR3 is exceeded. That DAC value is saved in table 43 as DAC3 at step 66 and represents the DAC setting that results in a laser light output power level of $P_3$. The laser current may also be measured as ADC3.

At step 67 a comparison is made of the slope of the upper portion of the curve to the slope at the lower portion of the curve in accordance with either expression 3 or 4 above. Step 67 determines whether the slope comparison has produced a result which is outside the boundaries of the criteria, that is, greater than a minimum acceptable value. At step 68, if the limit is exceeded, an end-of-life flag is raised.

If not, no flag is raised. The minimum value criteria is established at the factory and included in PROM 121.

The measurement of the slope as shown in FIG. 4 is taken periodically and each time the drive is powered up. As that might occur several times during the course of a day, each time the test is made a host can keep track of the indication. In that manner if one bad reading out of several is taken during a day maintenance personnel will know that the laser diode does not need replacement.

The machine operation shown in FIG. 4 is the same regardless of whether erasable or write-once media is used. For that matter, the operation is the same regardless of the application, i.e., CD-ROM applications, optical communication applications, or others. However, it may be desirable to change the criteria for different applications; for example, with write once media it is essential that the write level be maintained on a linear slope. Consequently, an indication of laser end-of-life may occur for a slope change of 10% whereas when writing erasable media a slope of 12% may be allowed before the end-of-life is predicted.

This invention has been described with respect to taking measure of the slope utilizing three power levels. If desired, the slope can be taken over several power intervals. Also, the invention can be performed with the objective lens in focus or out of focus. If write once media is being used, out of focus measurements are used in order to keep from writing on the media at high power levels. However, even with write once media, in focus measurements could be used by positioning the lens over safe areas, for example, the inner diameter which is not otherwise used. Note also that while the invention is described in terms of DAC values (expression 3) the slope ratio can also be expressed in terms of laser current. An ADC 70 is included in the circuit of FIG. 1 to obtain laser current measurements, convert them to digital values and supply the values to a processor 20 for the slope comparison.

While the invention has been particularly shown and described with reference to preferred embodiments thereof, it will be understood by those skilled in the art that various changes in form and details may be made therein without departing from the spirit and scope of the invention:

What is claimed is:

1. A method for detecting the approach of laser diode end-of-life comprising the mechanism-implemented steps of energizing said laser diode to produce a selected low laser power level (P1) within the lasing mode of laser operation and measuring the drive current level (I1) needed to produce said low power level, energizing said laser diode to produce a selected mid-range power level (P2), higher than P1, and measuring the drive current (I2) needed to produce said mid-range power level, energizing said laser diode to produce a selected high power level (P3), higher than P2, and measuring the drive current (I3) needed to produce said high power level, calculating the linear slope of the power vs. current characteristic curve of said laser diode at low power levels using the relationship $$S1 = \frac{P2 - P1}{I2 - I1}$$

calculating the linear slope of said power vs. current characteristic curve at high power levels using the relationship $$S2 = \frac{P3 - P2}{I3 - I2}$$

comparing S1 to S2, and if the comparison result is outside the boundary of predetermined criteria, reporting an indication of approaching laser end-of-life.

2. The method of claim 1 wherein said laser diode is employed in optical disk apparatus, and where all steps are performed at an out of focus condition so that optical media is not written upon at high power levels.

3. The method of claim 1 wherein said laser diode is employed in optical disk apparatus, and where all steps are performed at an in focus condition.

4. In apparatus for energizing a semiconductor laser diode to selected optical power levels, wherein a digital to analog convertor (DAC) is connected to control laser drive current and wherein said DAC is under the control of a microprocessor, a method for detecting the approach of laser diode end-of-life comprising the machine-implemented steps of energizing said laser diode to produce a selected low power level (P1) and recording the DAC value (DAC1) needed to produce said low power levels energizing said laser diode to produce a selected mid-range power level (P2), higher that P1, and recording the DAC value (DAC2) needed to produce said mid-range power level energizing said laser diode to produce a selected high power level (P3) higher than said mid-range levels, and recording the DAC value needed to produce said high power level, comparing the linear slope of the power vs. current characteristic curve at low power levels to the linear slope of said curve at high power levels using the relationship $$\frac{S2}{S1} = \frac{(P3 - P2)}{(P2 - P1)} \cdot \frac{(DAC2 - DAC1)}{(DAC3 - DAC2)}$$

reporting an indication of approaching laser end-of-life if the result of said comparing steps is outside the boundary of predetermined criteria.

5. The method of claim 4 wherein said laser diode is employed in optical disk apparatus, and where all steps are performed at an out of focus condition so that optical media is not written upon at high power levels.

6. The method of claim 4 wherein said laser diode is employed in optical disk apparatus, and where all steps are performed at an in focus condition.

7. Apparatus for predicting the approach of semiconductor diode end-of-life comprising a laser diode, a laser drive current control means connected to said laser diode for energizing said laser diode to their selected power levels, P1, P2, and P3, where P1 is the lowest power level and P3 is the highest power level microprocessor means an analog to digital converter means connected to said microprocessor means and coupled to said laser diode control means for measuring drive current levels I1, I2, and I3 corresponding to power levels P1, P2, and P3, said current levels supplied to said microprocessor means, said microprocessor means for comparing the linear slope of the power vs. current characteristic curve of said laser diode at high power levels to the linear slope of said curve at low power levels utilizing the relationship $$\frac{S2}{S1} = \frac{(P3 - P2)(I2 - I1)}{(P2 - P1)(I3 - I2)}$$

and for comparing the result S2/S1 to predetermined criteria and if exceeded, for reporting the approach of laser end-of-life.

8. The apparatus of claim 7 further including means for measuring the output power of said laser diode for establishing said selected power levels.

9. Apparatus for predicting the approach of semiconductor laser diode end of life comprising a laser diode laser drive current means connected to said laser diode laser drive current control means including a digital to analog converter (DAC) connected to said drive current means for energizing said diode to three selected power levels, P1, P2, and P3 where P1 is the lowest power level and P3 is the highest power level, microprocessor means, said DAC connected to said microprocessor means for reporting to said microprocessor means the DAC settings DAC1, DAC2, and DAC3 corresponding to drive current levels at power output levels P1, P2, and P3, said microprocessor means for comparing the linear slope of the power vs current characteristic curve of said laser diode at high power levels to the linear slope of said curve at low power levels utilizing the relationship $$\frac{S2}{S1} = \frac{(P3 - P2)(DAC2 - DAC1)}{(P2 - P1)(DAC3 - DAC2)}$$

and for comparing the result S2/S1 to predetermined criteria and, if exceeded, for reporting the approach of laser end of life.

10. The apparatus of claim 9 wherein said laser diode is employed in optical disk apparatus, and where all steps are performed at an out of focus condition so that optical media is not written upon at high power levels.

* * * * *